United States Patent
Ren

(10) Patent No.: US 7,834,708 B1
(45) Date of Patent: Nov. 16, 2010

(54) METHOD AND APPARATUS FOR ANALOG SMOOTH SWITCH IN VCO LOADING CONTROL

(75) Inventor: Chenxiao Ren, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/112,362

(22) Filed: Apr. 30, 2008

(51) Int. Cl.
 *H03K 3/03* (2006.01)
(52) U.S. Cl. .................. 331/57; 331/36 C; 331/177 R; 331/177 V; 331/16; 331/17
(58) Field of Classification Search .................. 331/10, 331/16, 17, 57, 177 R
See application file for complete search history.

(56) References Cited

U.S. PATENT DOCUMENTS

| | | | | |
|---|---|---|---|---|
| 5,847,617 A | * | 12/1998 | Reddy et al. .................. | 331/57 |
| 6,114,920 A | * | 9/2000 | Moon et al. .................. | 331/179 |
| 6,127,896 A | * | 10/2000 | Burzio .................. | 331/17 |
| 6,501,336 B2 | * | 12/2002 | Kim et al. .................. | 331/10 |
| 6,650,191 B2 | * | 11/2003 | Branch et al. .................. | 331/57 |
| 2005/0068112 A1 | * | 3/2005 | Glenn .................. | 331/16 |
| 2005/0175135 A1 | * | 8/2005 | Dosaka .................. | 375/376 |
| 2007/0120613 A1 | * | 5/2007 | Matsuta .................. | 331/57 |
| 2008/0007367 A1 | * | 1/2008 | Kim .................. | 331/36 C |
| 2008/0174349 A1 | * | 7/2008 | Luo et al. .................. | 327/157 |

* cited by examiner

*Primary Examiner*—Joseph Chang
*Assistant Examiner*—Jeffrey Shin
(74) *Attorney, Agent, or Firm*—Heimlich Law, PC; Alan Heimlich, Esq.

(57) ABSTRACT

A method and apparatus for analog smooth switch in VCO loading control, in one technique, receiving an input signal to adjust a frequency of an oscillator; activating one or more switches to control a current source/sink based on the received input signal; applying the current source/sink to a capacitor to adjust a voltage on the capacitor; and applying the voltage on the capacitor to one or more switches, each of the one or more switches connected between a load and a stage of the oscillator.

11 Claims, 7 Drawing Sheets

METHOD AND APPARATUS FOR ANALOG SMOOTH SWITCH IN VCO LOADING CONTROL

FIELD OF THE INVENTION

The present invention pertains to oscillators. More particularly, the present invention relates to a method and apparatus for analog smooth switch in VCO (Voltage Controlled Oscillator) loading control.

BACKGROUND OF THE INVENTION

In large VCO working range applications (e.g. PLL (Phase Lock Loop)) digital switching of the loading on the VCO ring is used to control the VCO frequency. This switching is used to enable, for example, PLLs to work better. FIG. 3 illustrates such VCO switching loading.

There is a relationship between the frequency and the loading. The relationship of VCO frequency (FVCO) and the loading of VCO ring (CL) will be like this:

$$FVCO \propto \frac{gm}{N \cdot CL}.$$

Where "gm" is equivalence impedance of a ring cell and "N" is the stage number of the VCO ring.

Thus when we turn on/off the switch, the "CL" is changed suddenly, and the "XVCTRL" will not change so fast because of our LOOP CAP, however, the VCO frequency will change suddenly. FIG. 4 shows the VCO frequency change when we turn on the switch (e.g. XS in FIG. 3) at "t0".

This sudden VCO frequency fluctuation may not be acceptable in real systems because the device following after such a PLL and/or the PLL itself may fail to keep up with the frequency change. This may present a problem.

BRIEF DESCRIPTION OF THE DRAWINGS

The invention is illustrated by way of example and not limitation in the figures of the accompanying drawings in which.

SUMMARY OF THE INVENTION

Figure 1:
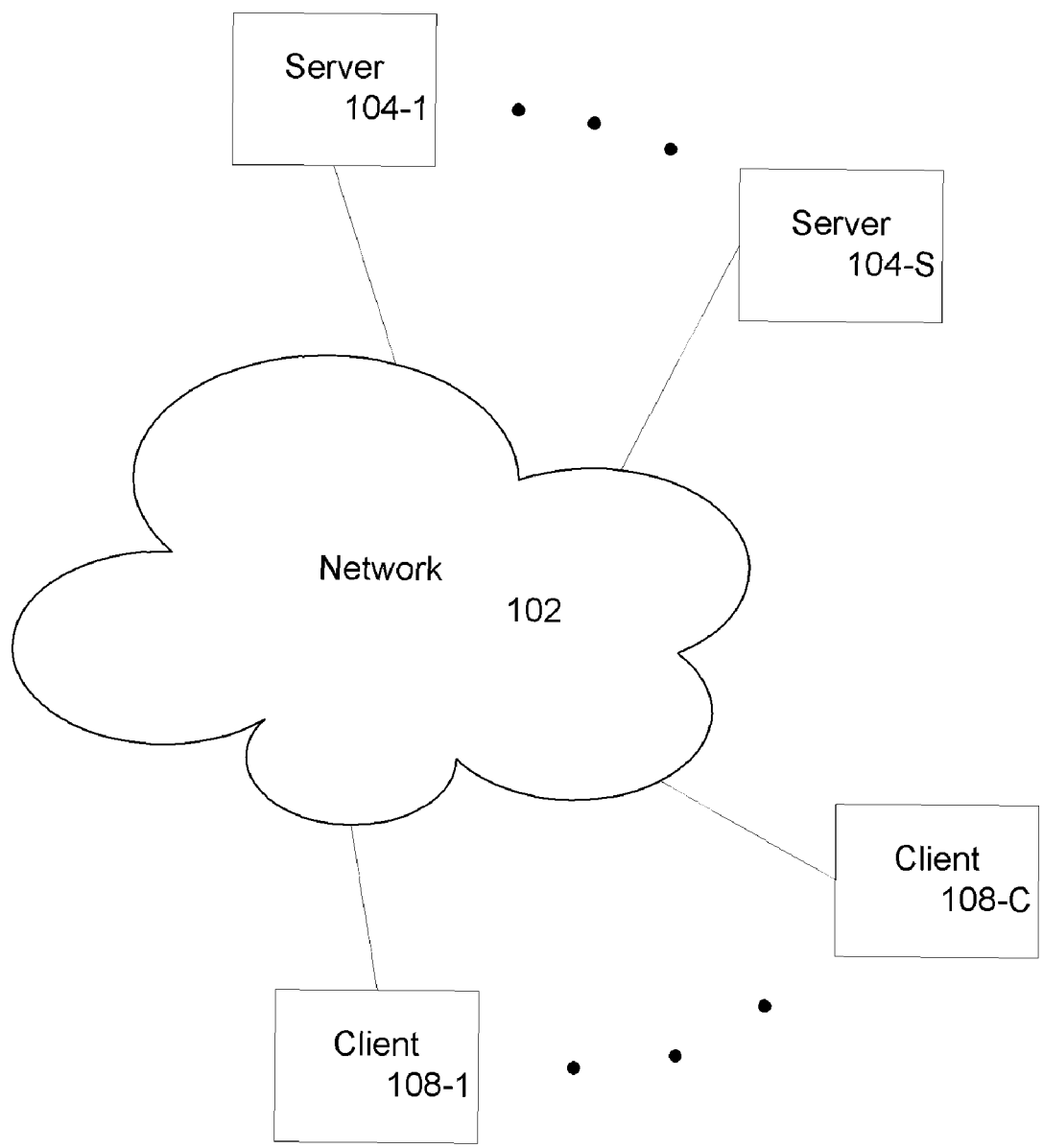
FIG. 1 illustrates a network environment in which the method and apparatus of the invention may be implemented.

Applicant(s) hereby submit that this Summary of the Invention complies with applicable CN (China i.e. SIPO) standards. All claims are literally copied here.

1. A method comprising:
   receiving an input signal to adjust a frequency of an oscillator;
   activating one or more switches to control a current source/sink based on said received input signal;
   applying said current source/sink to a capacitor to adjust a voltage on said capacitor; and
   applying said voltage on said capacitor to one or more switches, each of said one or more switches connected between a load and a stage of said oscillator.

2. The method of claim 1 wherein said current source/sink is a substantially constant current source/sink.

3. The method of claim 2 wherein each of said load is a substantially equal load.

4. An apparatus comprising:
   means for receiving a signal to smoothly adjust a frequency of a ring oscillator having RZ stages;
   means for controlling a current source/sink based on said received signal; means for using said current source/sink to control one or more switches in a linear mode; and
   means for coupling one or more loads through said one or more switches to one or more of said RZ stages.

5. The apparatus of claim 4 wherein said one or more loads are not equal loads.

6. The apparatus of claim 4 wherein said one or more loads are equal loads and wherein each of a RZ number of loads are respectively coupled to a corresponding RZ stage.

7. The apparatus of claim 4 further comprising means for adjusting a divider circuit based on said signal.

8. An apparatus comprising:
   a control block having an input and an output, said input coupled to receive a signal;
   a voltage converter having an input and an output, said input coupled to receive said control block output;
   a ring oscillator having one to SZ stages, each of said one to SZ stages having a respective input and output, said one or more of said one to SZ stages outputs producing a tangible usable output for a user; and
   a load block having an input and one to TZ load outputs, said input coupled to receive said voltage converter output; and one or more of said one to TZ loads coupled to one or more of said one to SZ stages inputs.

9. The apparatus of claim 8 wherein SZ and TZ are equal and one of each said one to TZ load outputs is coupled to one of each of said SZ stages inputs.

10. The apparatus of claim 9 wherein each of said one to TZ load outputs are substantially equal in load.

11. The apparatus of claim 10 wherein said load block further comprises one to QZ switches and one to QZ loads.

12. The apparatus of claim 11 wherein each of said one to QZ switches is coupled to a respective one to QZ loads.

DETAILED DESCRIPTION

In one embodiment of the invention, to limit a large sudden VCO frequency fluctuation smooth analog switching of VCO loading is used.

In one embodiment of the invention, a small current is used to charge/discharge a capacitor to generate a smooth ramping voltage which controls the bias voltage of MOS switches which control VCO ring loading. This leads to a more gradual and smooth VCO frequency shift.

Figure 5:
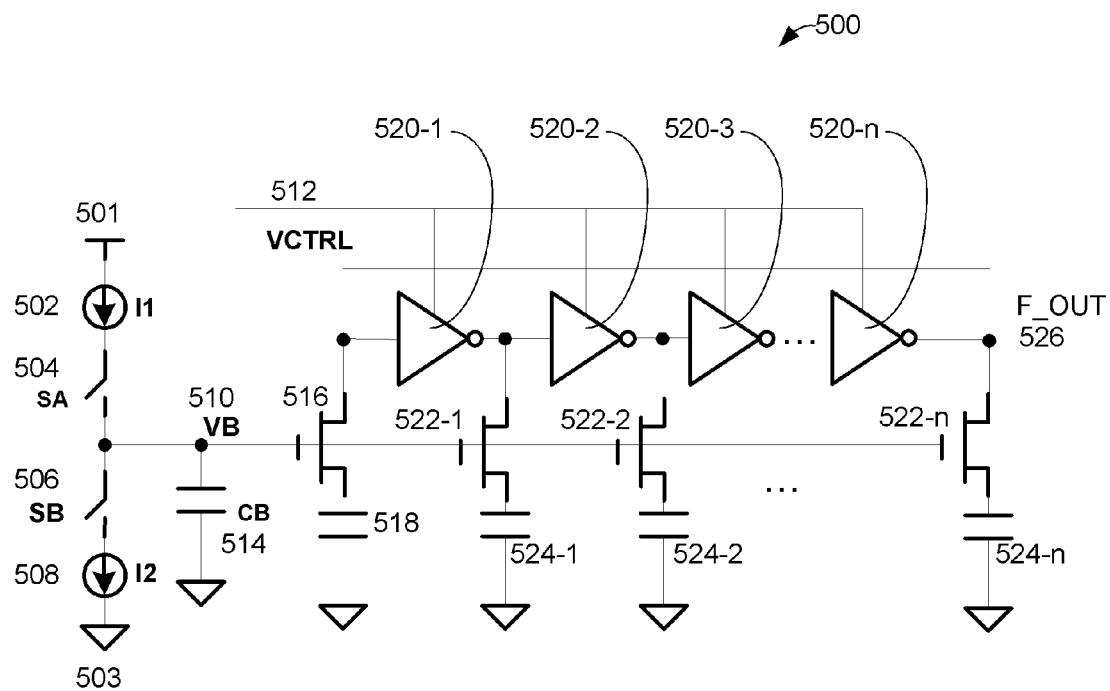
FIG. 5 illustrates one embodiment of the invention in schematic form.

FIG. 5 illustrates, generally at 500, one embodiment of the invention in schematic form. At 501 is a power supply voltage (e.g. positive, negative), at 503 a signal ground, at 502 a source of current, at 504 a switch SA, at 506 a switch SB, and at 508 a current source. At 510 is a node VB connected to a capacitor CB 514, and multiple gates of transistors 516, and 522-1, 522-2 through 522-n. At 512 is VCTRL which is connected to inverters 520-1, 520-2 through 520-n. Signal ground 503 is connected to current source 508, capacitor CB 514, and capacitors 518, and 524-1, 524-2 through 524-n. Node 526 F_OUT represents an output. Transistor 516 is also connected to the input of inverter 520-1 and the output of inverter 520-n. Transistor 516 is also connected to capacitor 518. Transistors 522-1, 522-2 through 522-n are respectively connected to capacitors 524-1, 524-2 through 524-n. The output of inverter 520-1 is connected to the input of 520-2 and transistor 522-1. The output of inverter 520-2 is connected to the input of 520-3 and transistor 522-2. The output of inverter 520-n-1 (not shown) is connected to the input of 520-n and transistor 522-n-1 (not shown).

A current source/sink is to be understood as an entity that can source or sink current based on the mode of operation. For example, in FIG. 5, with respect to capacitor CC 514, the arrangement of 501, 502, 504, 506, 508, and 503 can act to source or sink current based on the state of switches 504 and 506. If 504 is closed and 506 is open then, by convention, current is being source(d) to capacitor CC 514. If 504 is open and 506 is closed then, by convention, current is being sink (ed) from capacitor CC 514.

In one embodiment of the invention, for example, as illustrated in FIG. 5, the capacitive loading on the ring oscillator (e.g. 520-1 through 520-n) will rely on the transistor (e.g. NMOS or PMOS) switch resistance and when the control voltage "VB" 510 is controlled smoothly via ramping, the switch resistance will be changed smoothly, and the frequency of the ring oscillator will change smoothly. In one embodiment of the invention, for example, as illustrated in FIG. 5, the VB (510) ramp can be controlled by using a charge/discharge circuit (e.g. like charge pump) on a CAP "CB" 514, the ramping rate being determined by "I1" 502 and "CB" 514 and "I2" 508 and "CB" 514.

In one embodiment of the invention, for example, as illustrated in FIG. 5, a smooth VCO frequency change may be effected by smoothly switching the VCO loading, for example by applying analog VCO loading control. The VCO frequency is decided by the loading of the ring oscillator when it is switched, and the loading of ring oscillator is determined by the turn-on resistance of the switch, and the turn-on resistance of the switch which is controlled by the control voltage ("VB"). When the control voltage "VB" is smoothly ramping, the NMOS switch resistor will be changed smoothly, the loading of the ring oscillator (Ring OSC) will change smoothly, then the frequency of the Ring OSC will change smoothly. Smooth ramping of the VB control voltage my be achieved by using an analog charging/discharging device such as a current and a capacitor. For example, as illustrated in FIG. 5, one approach is to use a current I1 (502) and I2 (506) and capacitor CB 514 to create a smooth ramping control voltage VB (510). Note that even though digital switches may be used (for example SA 504 and SB 506) to control the current sources (for example I1 (502) and I2 (506)) the voltage ramp will be analog in nature. When the digital control turns on the switch "SA" 504 (and turning off the switch "SB" 506 at the same time), the small current will charge to the capacitor CB 514, letting the voltage of the capacitor ramp linearly, and the ramping time can be controlled by the current and the capacitor size. Smooth ramping voltage to control the switch will get a smooth ramping VCO frequency (N.B. not necessarily linear).

Figure 6:
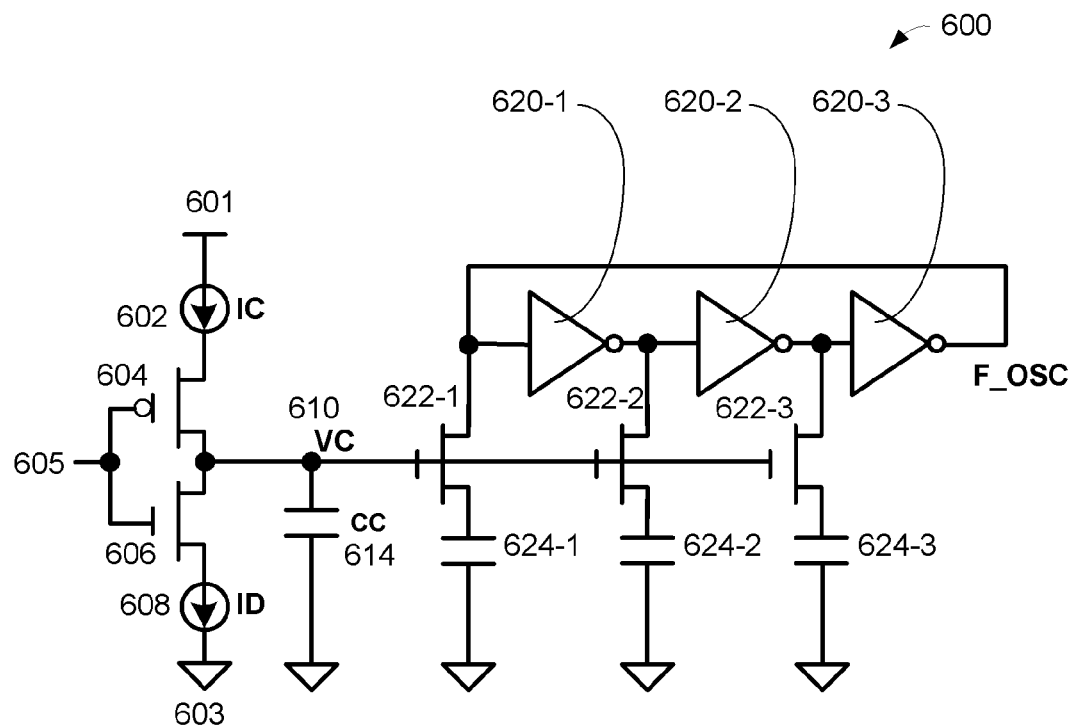
FIG. 6 illustrates one embodiment of the invention showing a 3 stage ring oscillator.

FIG. 6 illustrates, generally at 600, one embodiment of the invention showing a 3 stage ring oscillator. At 601 is a power supply voltage (e.g. positive, negative), at 603 a signal ground, at 602 a source of current, at 604 a PMOS switch, at 606 an NMOS switch, at 605 an input, and at 608 a current source. At 610 is a node VC connected to a capacitor CC 614, and the gates of transistors 622-1, 622-2, and 622-3. Transistors 622-1, 622-2, and 622-3 are respectively connected to capacitors 624-1, 624-2, and 624-3. Transistors 622-1, 622-2, and 622-3 are respectively connected to the inputs of inverters 620-1, 620-2, and 620-3. The output of inverter 620-1 is connected to the input of 620-2. The output of inverter 620-2 is connected to the input of 620-3. The output of inverter 620-3 is connected to the input of 620-4. F_OSC at the output of inverter 620-3 denotes the frequency of oscillation of the ring oscillator. Signal ground 603 is connected to current source 608, capacitor CC 614, and capacitors 624-1, 624-2, and 624-3.

In one embodiment of the invention, as illustrated for example in FIG. 6, the capacitance loading on the ring oscillator (for example 620-1, 620-2, and 620-3) relies on the MOS switch (e.g. NMOS) resistance which is controlled by the control voltage VC 610 which in turn is a function of the current (IC 602 or ID 608) flowing either into or out of the capacitor CC 614 which is controlled by the switches 604 and 606 which are controlled by a signal at 605 (e.g. digital).

Figure 7:
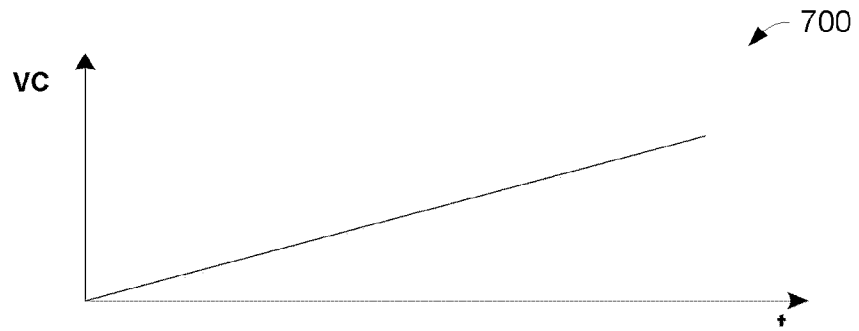
FIG. 7 illustrates one embodiment of the invention showing a control voltage.

FIG. 7 illustrates, generally at 700, one embodiment of the invention showing how the control voltage, such as VC in FIG. 6, may vary with time.

Figure 8:
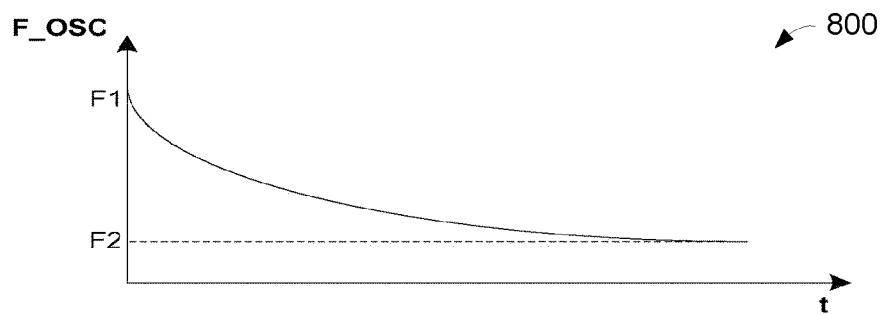
FIG. 8 illustrates one embodiment of the invention showing a frequency change.

FIG. 8 illustrates, generally at 800, one embodiment of the invention showing how the frequency, such as F_OSC in FIG. 6, may vary with control voltage, such as VC in FIG. 7.

It is to be appreciated that, for example, in FIG. 6 by having the voltage VC 610 ramp in a linear fashion such as illustrated in FIG. 7, that transistors 622-1, 622-2, and 622-3 may be operated in a linear mode rather than simply on/off.

Figure 9:
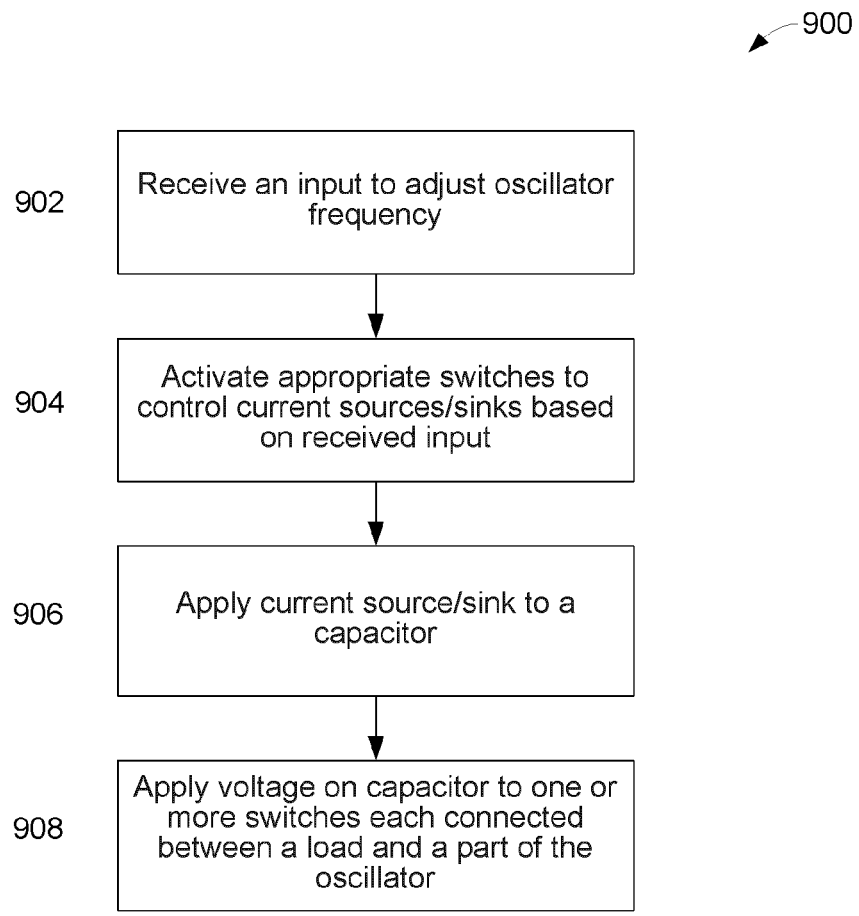
FIG. 9 illustrates one embodiment of the invention in flow chart form.

FIG. 9 illustrates, generally at 900, one embodiment of the invention in flow chart form. At 902 an input to adjust an oscillator frequency is received. At 904 appropriate switches are activated to control a current source/sink based on the received input. At 906 the current source/sink is applied to a capacitor. At 908 the voltage on the capacitor is applied to one or more switches each switch being connected between a load and a part of the oscillator.

Figure 10:
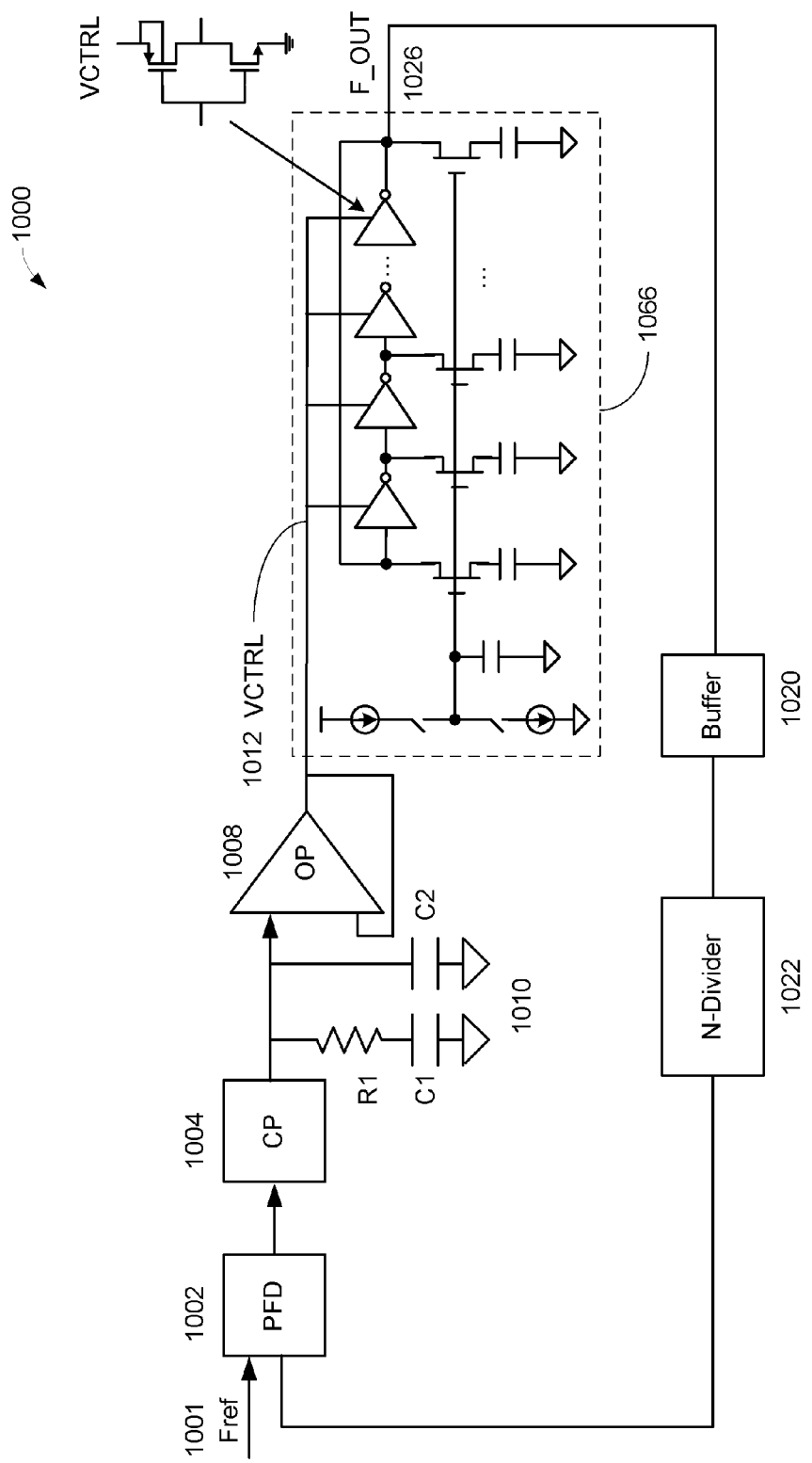
FIG. 10 illustrates one embodiment of the invention as part of a PLL.

FIG. 10 illustrates, generally at 1000, one embodiment of the invention as part of a PLL. At 1066 is a functional block which may be, for example, one embodiment of the invention as shown in FIG. 5. At 1012 is VCTRL which is the supply voltage to the inverters (e.g. VCC, VDD, etc.) at 1026 is the output of the ring oscillator F_OUT. PFD at 1002 is frequency phase detector having an input frequency reference Fref, and an output from N-Divider 1022. The output of PFD goes to CP 1004 a charge pump. The output of CP 1004 is filtered by R and C components at 1010 (R1C1 and C2 e.g. LOOP CAP) and goes to the input of OP 1008 shown here as a unit gain buffer. F_OUT 1026 goes to Buffer 1020 whose output goes to N-Divider 1022.

In one embodiment of the invention, for example as shown in FIG. 10, if the frequency of operation is to change from, for example, 800 MHz to 400 MHz, then N-Divider may be changed from divide by 2 to divide by 1 (e.g. by bypassing a divide circuit) at the same time that the ring switch load is turned on. In this way the VCTRL 1012 may remain in the same approximate voltage range for controlling the ring oscillator. Without such loading, the VCTRL would be required to be lower. The smooth switching of the ring switch load allows the frequency of the ring to change smoothly.

One of skill in the art will appreciate that while embodiments of the invention may use digital switches to control current flow into/out of a capacitor, the invention is not so limited, and analog switches may also be used to control current flow into/out of the capacitor. This may allow for finer control and alternate ramping rates. For example, modulating the charging current into a capacitor will control the slope of a ramping voltage.

While the invention has been illustrated with transistor switches such as, but not limited to NMOS and PMOS, the invention is not so limited. Switches may be any type that allows for control. For example, transmission gates may be used.

While the invention has been illustrated, in several embodiments, with switches connecting loads to each stage of a ring oscillator, the invention is not so limited. For example, in FIG. 5, for one embodiment of the invention, switch 622-3 and load 624-3 may be omitted.

It is to be understood that embodiments of the invention produce tangible physical results for a user. For example, the output of a ring oscillator driving a speaker to produce physical movement of a cone. Other useful tangible physical outputs may include, but are not limited to, visual displays, etc.

Thus a method and apparatus for analog smooth switch in VCO loading control have been described.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
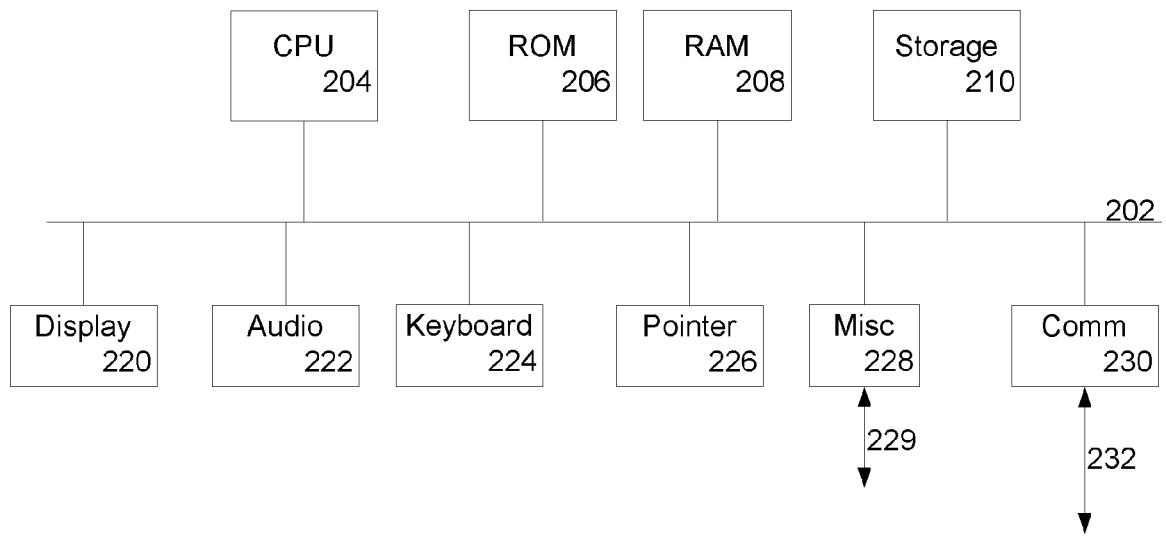
FIG. 2 is a block diagram of a computer system in which some embodiments of the invention may be used.
Figure 3:
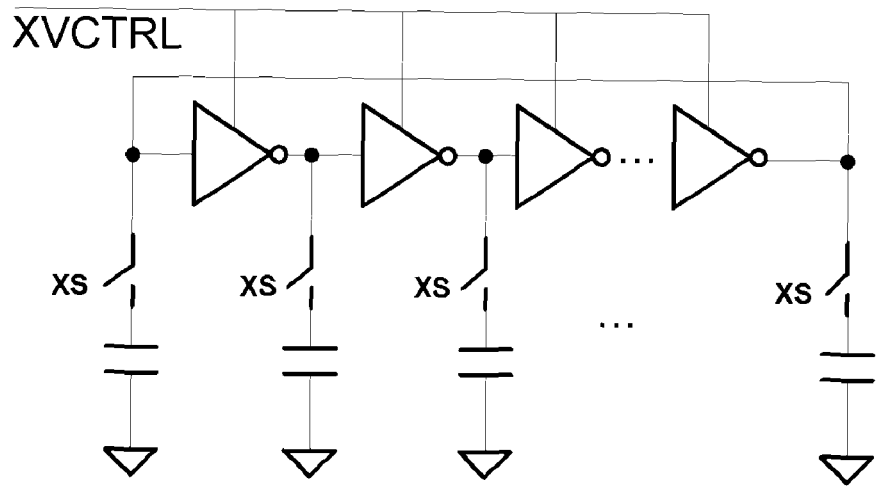
FIG. 3 illustrates a VCO ring with load switches.
Figure 4:
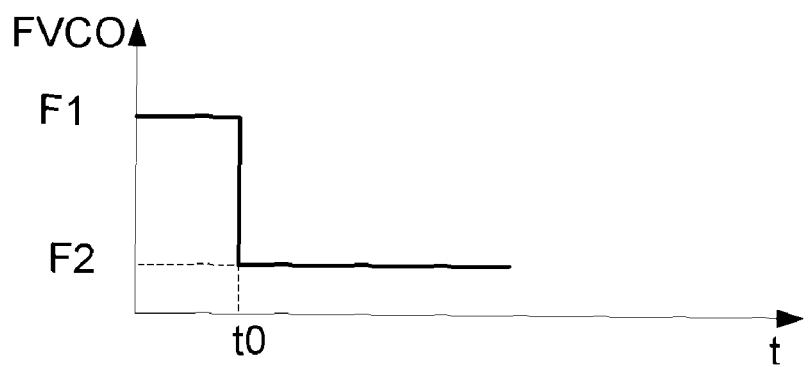
FIG. 4 illustrates an effect of VCO load switching.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, ... ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very very close or similar. Since two physical entities can never be exactly equal, a phrase such as "substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for analog smooth switch in VCO loading control have been described.

What is claimed is:

1. A method comprising:
   receiving an input signal to adjust a frequency of an oscillator;
   activating one or more switches to control a current source/sink based on said received input signal;
   applying said current source/sink to a capacitor to adjust a voltage on said capacitor;
   applying said voltage on said capacitor to one or more switches, each of said one or more switches connected between a load and a stage of said oscillator; and
   adjusting a divider circuit based on said input signal.

2. The method of claim 1 wherein said current source/sink is a substantially constant current source/sink.

3. The method of claim 2 wherein each of said load is a substantially equal load.

4. An apparatus comprising:
means for receiving a signal to smoothly adjust a frequency of a ring oscillator having RZ stages;
means for controlling a current source/sink based on said received signal;
means for using said current source/sink to control one or more switches in a linear mode;
means for coupling one or more loads through said one or more switches to one or more of said RZ stages; and
means for adjusting a divider circuit based on said signal.

5. The apparatus of claim 4 wherein said one or more loads are not equal loads.

6. The apparatus of claim 4 wherein said one or more loads are equal loads and wherein each of a RZ number of loads are respectively coupled to a corresponding RZ stage.

7. An apparatus comprising:
a control block having an input and an output, said input coupled to receive a signal;
a voltage converter having an input and an output, said input coupled to receive said control block output;
a ring oscillator having one to SZ stages, each of said one to SZ stages having a respective input and output, said one or more of said one to SZ stages outputs producing a tangible usable output for a user;
a load block having an input and one to TZ load outputs, said input coupled to receive said voltage converter output; and one or more of said one to TZ loads coupled to one or more of said one to SZ stages inputs; and
a divider circuit having a control input, said control input coupled to receive said signal.

8. The apparatus of claim 7 wherein SZ and TZ are equal and one of each said one to TZ load outputs is coupled to one of each of said SZ stages inputs.

9. The apparatus of claim 8 wherein each of said one to TZ load outputs are substantially equal in load.

10. The apparatus of claim 9 wherein said load block further comprises one to QZ switches and one to QZ loads.

11. The apparatus of claim 10 wherein each of said one to QZ switches is coupled to a respective one to QZ loads.

* * * * *